(12) United States Patent
Noguchi et al.

(10) Patent No.: US 6,548,830 B1
(45) Date of Patent: Apr. 15, 2003

(54) SEMICONDUCTOR DEVICE FORMED OF SINGLE CRYSTAL GRAINS IN A GRID PATTERN

(75) Inventors: Takashi Noguchi, Kanagawa (JP); Yasuhiro Kanaya, Kanagawa (JP); Masafumi Kunii, Kanagawa (JP); Yuji Ikeda, Kanagawa (JP); Setsuo Usui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/616,685

(22) Filed: Jul. 14, 2000

Related U.S. Application Data

(62) Division of application No. 08/861,197, filed on May 21, 1997, now Pat. No. 6,190,949.

(30) Foreign Application Priority Data

May 22, 1996 (JP) ............................................. 08-150306
Mar. 24, 1997 (JP) ............................................. 09-088728

(51) Int. Cl.[7] .......................... H01L 29/76; H01L 29/04; H01L 27/108; H01L 31/036; H01L 27/01
(52) U.S. Cl. .............................. 257/66; 257/64; 257/70; 257/72; 257/75; 257/347
(58) Field of Search ........................... 257/66, 72, 64, 257/70, 75, 347

(56) References Cited

U.S. PATENT DOCUMENTS

| | | | |
|---|---|---|---|
| 4,059,461 A | 11/1977 | Fan et al. ..................... | 148/1.5 |
| 4,768,076 A | 8/1988 | Aoki et al. ................... | 257/369 |
| 4,933,298 A | 6/1990 | Hasegawa ..................... | 438/150 |
| 5,122,223 A | 6/1992 | Geis et al. .................... | 156/603 |
| 5,304,357 A | 4/1994 | Sato et al. .................... | 422/250 |
| 5,365,875 A | 11/1994 | Asai et al. .................... | 117/7 |
| 5,496,768 A | 3/1996 | Kudo ........................ | 438/487 |
| 5,591,668 A | 1/1997 | Maegawa et al. ............ | 438/799 |
| 5,597,621 A | 1/1997 | Hummel et al. .............. | 427/554 |
| 5,756,364 A | 5/1998 | Tanaka et al. ................ | 438/30 |
| 5,904,550 A | 5/1999 | Yamaguchi .................. | 438/487 |
| 6,335,541 B1 * | 1/2002 | Ohtani et al. ................. | 257/66 |

FOREIGN PATENT DOCUMENTS

JP 59-138329 * 8/1984 ................. 257/66

OTHER PUBLICATIONS

Kuriyama et al, "High Mobility Poly–Si TFT by a New Excimer Laser Annealing Method for Large Area Electronics", *IEEE IEDM 91,* 1991, pp. 563–566.
Asai et al, "Poly–Silicon Thin–Film Transistors with Uniform Performance Fabricated by Excimer Laser Annealing", *Jpn. J. Appl. Phys.,* vol. 32, 1993, pp. 474–481.
Ghandhi, VLSI Fabrication Principles Silicon and Gallium Arsenide, 1994, pp. 19–21.
Kuriyama et al, "Comprehensive Study of Lateral Grain Growth in Poly–Si Films by Excimer Laser Annealing and its Application to Thin Film Transistors", *Jpn. J. Appl. Phys.,* vol. 33, Oct. 1994, pp. 5657–5662.
Kuriyama, "Excimer laser crystallization of silicon films for AMLCDs", *AMLCDs '95,* 1995, pp. 87–92.
Tiwari et al, "A silicon nanocrystals based memory", *Applied Physics Letters,* 68 (10), Mar. 4, 1976, pp. 1377–1379.
El–Kader et al, "Light–emitting Si prepared by laser annealing of a–Si:H", *Thin Solid Films,* 225 (1995), pp. 302–304.

* cited by examiner

*Primary Examiner*—Steven Loke
(74) *Attorney, Agent, or Firm*—Sonnenschein, Nath & Rosenthal

(57) ABSTRACT

A semiconductor device comprising a source/drain region and a channel region formed in a silicon thin film composed of a group of silicon single crystal grains which are each approximately rectangular-shaped and which are arranged in a grid pattern on the base body, where a selected orientation of the silicon single crystal grains to the surface of the base body is approximately the <100> direction.

7 Claims, 10 Drawing Sheets

SEMICONDUCTOR DEVICE FORMED OF SINGLE CRYSTAL GRAINS IN A GRID PATTERN

CROSS-REFERENCE TO RELATED APPLICATIONS

This is a divisional application of U.S. Ser. No. 08/861,197, filed May 21, 1997, now U.S. Pat. No. 6,190,949.

BACKGROUND OF THE INVENTION

The present invention relates to a new silicon thin film, a group of silicon single crystal grains, and formation processes thereof, and a semiconductor device, a flash memory cell, and fabrication processes thereof.

A silicon thin film composed of a group of silicon single crystal grains formed on a base body has been used for various kinds of semiconductor devices such as a thin film transistor (hereinafter, referred to as a "TFT") and a semiconductor device based on a SOI (Silicon On Insulator) technique, and for solar cells; and it is being examined to be applied to production of micromachines.

In the field of semiconductor devices, for example, a stacked SRAM using TFTs as load elements has been proposed. TFTs have been also used for LCD (Liquid Crystal Display) panels. And, in general, a silicon thin film composed of a group of silicon single crystal grains is used for a TFT required to be enhanced in electric characteristics such as a carrier mobility ($\mu$), conductivity ($\sigma$), on-current characteristic, subthreshold characteristic, and on/off current ratio. Concretely, efforts are being made to improve characteristics of SRAMs and TFTs by increasing sizes of silicon single crystal grains in combination with reduction in density of twin crystals for lowering a trap density in the silicon single crystal grains.

The enlargement in size (up to 1 $\mu$m) of silicon single crystal grains for improving the electric characteristics of such a silicon thin film has been examined by a SPC (Solid Phase Crystallization, solid phase crystallization from amorphous silicon) technique or an ELA (Excimer Laser Anneal, liquid phase crystallization using excimer laser). One process of forming a silicon thin film using the ELA technique has been known, for example, from a document ["Dependence of Crystallization Behaviors of Excimer Laser Annealed Amorphous Silicon Film on the Number of Laser Shot", B. Jung, et al., AM-LCD 95, PP. 177–120]. This document describes that a silicon thin film composed of silicon single crystal grains whose selected orientation is approximately the <111> direction can be formed by repeatedly irradiating excimer laser beams on an amorphous silicon layer. Another process of forming a silicon thin film using the ELA technique has been also known, for example, from a document ["Crystal forms by solid-state recrystallization of amorphous Si film on $SiO_2$", T. Noma, Appl. Phys. Lett. 59 (6), Aug. 5, 1991,pp. 653–655]. This document describes that silicon single crystal grains are oriented in the <110> direction, and they include fine {111} twin crystals.

A process of forming a silicon thin film by graphoepitaxial growth using a strip-heater has been known, for example, from a document [Silicon graphoepitaxy using a strip-heater oven", M. W. Geis, et al., Appl. Phys. Lett. 37(5), Sep. 1, 1980, pp. 454–456]. This document describes that a silicon thin film formed on $SiO_2$ is composed of a (100) aggregation structure.

A silicon thin film composed of a group of silicon single crystal grains has been also formed by a chemical-vapor deposition (CVD) process or a random solid-phase growth process. For example, the formation of polysilicon crystal grains by CVD has been known from Japanese Patent Laid-open Nos. Sho 63-307431 and Sho 63-307776. In the techniques disclosed in these documents, the selected orientation of silicon single crystal grains is the <111> direction. Incidentally, in the case where a silicon thin film composed of a group of silicon single crystal grains having large sizes is formed by a normal chemical vapor deposition process, it cannot satisfy a uniform quality, a reduced leak, and a high mobility. In the random solid-phase growth process, it is possible to form a silicon thin film composed of a group of silicon single crystal grains having an average grain size of 1 $\mu$m or more; however, it is difficult for silicon single crystal grains to selectively grow. Further, in the TFT using the silicon thin film formed by such a process, since grain boundaries tend to be present in a TFT active region, there occurs a problem that TFT characteristics are varied depending on the presence of the grain boundaries, to thereby shorten the life time of the TFT.

In all of the techniques disclosed in the above-described references, no attempts has been not made to regularly arrange a group of silicon single crystal grains on an insulating film. If a group of silicon single crystal grains can be regularly arranged on an insulating film, the TFT characteristics can be highly controlled and equalized, and also one TFT can be formed in each of the silicon single crystal grains. This is expected to further develop the SOI technique.

A process of arranging silicon nuclei or crystal nuclei at desired positions and forming silicon single crystal grains having large sizes on the basis of the silicon nuclei or crystal nuclei has been known, for example, from Japanese Patent Laid-open Nos. Hei 3-125422, Hei 5-226246, Hei 6-97074, and Hei 6-302512. In the technique disclosed in Japanese Patent Laid-open No. Hei 3-125422, micro-sized silicon nuclei or crystal nuclei must be formed by patterning using a lithography process; however, there is a limitation to accurately form these micro-sized silicon nuclei or crystal nuclei by the present lithography technique. In the case where the sizes of silicon nuclei or crystal nuclei are large, polycrystals tend to be formed with twin crystals and dislocations easily produced, resulting in the reduced throughput. In the techniques disclosed in Japanese Patent Lid-open Nos. Hei 5-226246, Hei 6-97074, and Hei 6-302512, it is necessary to irradiate an energy beam enabling fine convergence and direct scanning onto an amorphous silicon layer or to carry out ion implantation. Accordingly, these techniques have problems that not only the step of forming silicon single crystal grains is complicated, but also it takes a lot of time to form silicon single crystal grains because of the necessity of a solid phase growth step, resulting in the reduced throughput.

On the other hand, non-volatile memories are being extensively developed at present. In particular, a flash memory having a floating gate structure is being examined from the viewpoint of the reduced size of the memory cell and the lowered voltage. In a flash memory, data is written or erased by injecting or discharging an electric charge into or from the floating gate. Of various electric charge injecting methods, a channel hot electron injection method or a method of allowing a Fowler-Nordheim's tunnel current to flow by applying a high electric field (for example, 8 MV/cm or more) on a tunnel oxide film are generally used.

In such a flash memory cell, it has been known that a threshold voltage after erasion of data is varied depending on variations in sizes of polycrystalline silicon grains forming a floating gate, for example, from a document ["Non-volatile Memory and Its Scaling", Journal of Japan Society of Electron Information Communication, Vol. 9, No. 5, pp. 469–484 (May, 1996)]. Further, as one means for realizing a future fine flash memory cell operated at a low voltage, a flash memory including a floating gate composed of silicon nanocrystals has been proposed in a document ["A silicon nanocrystal based memory", S. Tiwari, et al., Appl. Phys. Lett. 68 (10), 4, pp. 1377–1379, Mar. 4, 1996]. Additionally, as one form of a non-volatile memory to lead the next generation over the present semiconductor device, a single electron memory operated at a low voltage using a small storage electric charge (electron) has been proposed in a document ["A Room-temperature Single-Electron Memory Device Using Fine-Grain Polycrystalline Silicon", K. Yano, et. al., IEDM93, PP. 541–544].

To realize a flash memory cell hard to be varied in a threshold voltage after erasion of data, it is necessary to make as small as possible variations in sizes of silicon crystal grains forming a floating gate. Also, to realize a fine flash memory cell operated at a low voltage, it is necessary to regularly form fine silicon crystal grains on a thin insulating film (tunnel oxide film) with an excellent controllability.

SUMMARY OF THE INVENTION

An object of the present invention is to provide a process of easily, effectively forming a group of silicon single crystal grains in a grid pattern on a base body with the reduced variations in grain size, and a group of silicon single crystal grains formed by the process.

Another object of the present invention is to provide a process of easily, effectively forming a silicon thin film composed of a group of silicon single crystal grains which are arranged in a grid pattern on a base body with the reduced variations in grain size, and a silicon thin film formed by the process.

A further object of the present invention is to provide a process of fabricating a semiconductor device using the above silicon thin film or the above group of silicon single crystal grains, and a semiconductor device fabricated by the process.

An additional object of the present invention is to provide a process of fabricating a flash memory cell using the above silicon thin film or the above group of silicon single crystal grains, and a flash memory cell fabricated by the process.

To achieve the above object, according to the present invention, there is provided a process of forming a silicon thin film, including the step of: irradiating a pulsed rectangular ultraviolet beam on an amorphous or polycrystalline silicon layer formed on a base body, to thereby form a silicon thin film composed of a group of silicon single crystal grains on the base body; wherein the moved amount or amount of movement (L) of a ultraviolet beam irradiating position in a period from completion of an irradiation of the rectangular ultraviolet beam to starting of the next irradiation of the rectangular ultraviolet beam is specified at 40 $\mu$m or less, and a ratio (R=L/W) of the moved amount to a width (W) of the rectangular ultraviolet beam measured in the movement direction thereof is in a range of 0.1 to 5%, preferably, in a range of 0.5 to 2.5%, whereby forming a silicon thin film composed of a group of silicon single crystal grains which are each approximately rectangular-shaped and which are arranged in a grid pattern on the base body, a selected orientation of the silicon single crystal grains to the surface of the base body being approximately the <100> direction.

According to the present invention, there is provided a silicon thin film including a group of silicon single crystal grains which are each approximately rectangular-shaped and which are arranged in a grid pattern on a base body, wherein a selected orientation of the silicon single crystal grains to the surface of the base body is approximately the <100> direction.

To achieve the above object, according to the present invention, there is provided a process of fabricating a semiconductor device, including the steps of: irradiating a pulsed rectangular ultraviolet beam on an amorphous or polycrystalline silicon layer formed on a base body, to form a silicon thin film composed of a group of silicon single crystal grains on the base body; and forming a source/drain region and a channel region in the silicon thin film or the silicon single crystal grains;wherein the moved amount (L) of a ultraviolet beam irradiating position in a period from completion of an irradiation of the rectangular ultraviolet beam to starting of the next irradiation of the rectangular ultraviolet beam is specified at 40 $\mu$m or less, and a ratio (R=L/W) of the moved amount to a width (W) of the rectangular ultraviolet beam measured in the movement direction thereof is in a range of 0.1 to 5%, preferably, in a range of 0.5 to 2.5%, whereby forming a silicon thin film composed of a group of silicon single crystal grains which are each approximately rectangular-shaped and which are arranged in a grid pattern on the base body, a selected orientation of the silicon single crystal grains to the surface of the base body being approximately the <100> direction.

According to the present invention, there is provided a semiconductor device including a source/drain region and a channel region formed in a silicon thin film composed of a group of silicon single crystal grains which are each approximately rectangular-shaped and which are arranged in a grid pattern on a base body or formed in the silicon single crystal grains, wherein a selected orientation of the silicon single crystal grains to the surface of the base body is approximately the <100> direction.

As the semiconductor device of the present invention or the semiconductor device fabricated by the process of fabricating a semiconductor device of the present invention, there may be exemplified a top gate type or a bottom gate type thin film transistor used for LCD panels, a semiconductor device based on the SOI technique (for example, a thin film transistor as a load element of a stacked SRAM), and a MOS type semiconductor device. The silicon thin film and the formation process thereof according to the present invention can be applied not only to fabrication of these semiconductor devices but also to production of solar cells and to fabrication of micromachines.

In the silicon thin film and the formation process thereof, and the semiconductor device and the fabrication process thereof according to the present invention, a length of one side of a silicon single crystal grain approximately rectangular-shaped may be 0.05 $\mu$m or more, preferably, 0.1 $\mu$m or more. Here, the wording "a silicon single crystal grain approximately rectangular-shaped" means not only a perfectly rectangular silicon single crystal grain but also an imperfectly rectangular silicon single crystal grain having a chipped corner. The length of one side of an imperfectly rectangular silicon single crystal grains having a chipped corner means the length of one side of a virtual rectangular single crystal grain obtained by filling up the chipped corner. The same shall apply hereinafter. The average thickness of a silicon thin film may be in a range of $1 \times 10^{-8}$ m to $1 \times 10^{-7}$ m, preferably, in a range of $1 \times 10^{-8}$ m to $6 \times 10^{-8}$ m, more preferably, in a range of $1 \times 10^{-8}$ m to $4 \times 10^{-8}$ m. When the average thickness of a silicon thin film is less than $1\times10^{-8}$ m, there is a difficulty in fabrication of a semiconductor device using the silicon thin film. On the other hand, when it is more than $1\times10^{-7}$ m, the thickness of an amorphous or polycrystalline silicon layer required to ensure the thickness of the silicon thin film is excessively thick, and consequently, the selected orientation of the silicon single crystal grains is possibly out of approximately the <100> direction. The average thickness of a silicon thin film may be measured by an ellipsometer, interference spectrometer, or the like.

In the silicon thin film and the semiconductor device using the silicon thin film according to the present invention, a group of silicon single crystal grains constituting the silicon thin film may be formed by irradiating a pulsed rectangular ultraviolet beam on an amorphous or polycrystalline silicon layer formed on a base body, and the moved amount (L) of a ultraviolet beam irradiating position in a period from completion of an irradiation of the rectangular ultraviolet beam to starting of the next irradiation of the rectangular ultraviolet beam may be specified at 40 $\mu$m or less, and a ratio (R=L/W) of the moved amount to a width (W) of the rectangular ultraviolet beam measured in the movement direction thereof may be in a range of 0.1 to 5%, preferably, in a range of 0.5 to 2.5%. In the silicon thin film and the formation process thereof, and the semiconductor device and the fabrication process thereof according to the present invention, opposed sides of the silicon single crystal grain approximately rectangular-shaped may be approximately in parallel to the movement direction of the ultraviolet beam irradiating position or intersect the movement direction of the ultraviolet beam irradiating position at approximately 45°. Crystal planes constituting these two sides are the {220} planes. That is, a crystal plane constituting one side of a silicon single crystal grain approximately rectangular-shaped is the {220} plane.

To achieve the above object, according to the present invention, there is provided a process of forming a group of silicon single crystal grains including: a step (a) of irradiating a pulsed rectangular ultraviolet beam on an amorphous or polycrystalline silicon layer formed on a base body, to thereby form a silicon thin film composed of a group of silicon single crystal grains which are each approximately rectangular-shaped and which are arranged in a grid pattern on the base body, a selected orientation of the silicon single crystal grains to the surface of the base body being approximately the <100> direction; and a step (b) of separating adjacent ones of the silicon single crystal grains to each other; wherein the moved amount (L) of a ultraviolet beam irradiating position in a period from completion of an irradiation of the rectangular ultraviolet beam to starting of the next irradiation of the rectangular ultraviolet beam is specified at 40 $\mu$m or less, and a ratio (R=L/W) of the moved amount to a width (W) of the rectangular ultraviolet beam measured in the movement direction thereof is in a range of 0.1 to 5%, preferably, 0.5 to 2.5%.

According to the present invention, there is provided a group of silicon single crystal grains, including a plurality of silicon single crystal grains which are each approximately rectangular-shaped and which are arranged in a grid pattern on a base body, wherein a selected orientation of the silicon single crystal grains to the surface of the base body is approximately the <100> direction, and adjacent ones of the silicon single crystal grains are separated from each other.

To achieve the above object, according to the present invention, there is provided a process of fabricating a flash memory cell, including: a step (a) of irradiating a pulsed rectangular ultraviolet beam on an amorphous or polycrystalline silicon layer formed on a tunnel oxide film, to form a silicon thin film composed of a group of silicon single crystal grains which are each approximately rectangular-shaped and which are arranged in a grid pattern on the tunnel oxide film, a selected orientation of the silicon single crystal grains to the surface of the tunnel oxide film is approximately the <100> direction; and a step (b) of separating adjacent ones of the silicon single crystal grains to each other, whereby forming a floating gate composed of the group of silicon single crystal grains; wherein the moved amount (L) of a ultraviolet beam irradiating position in a period from completion of an irradiation of the rectangular ultraviolet beam to starting of the next irradiation of the rectangular ultraviolet beam is specified at 40 $\mu$m or less, and a ratio (R=L/W) of the moved amount to a width (W) of the rectangular ultraviolet beam measured in the movement direction thereof is in a range of 0.1 to 5%, preferably, 0.5 to 2.5%.

According to the present invention, there is provided a flash memory cell including a floating gate composed of a plurality of silicon single crystal grains which are each approximately rectangular-shaped and which are formed on a tunnel oxide film, a selected orientation of the silicon single crystal grains to the surface of the tunnel oxide film being approximately the <100> direction; wherein the silicon single crystal grains are arranged in a grid pattern on the tunnel oxide film and adjacent ones of the silicon single crystal grains are separated from each other. In addition, the thickness of each of the silicon single crystal grains separated from each other may be in a range of $1\times10^{-8}$ m to $11\times10^{-7}$ m, preferably, $1\times10^{-8}$ m to $8\times10^{-8}$ m, more preferably, in a range of $2\times10^{-8}$ m to $5\times10^{-8}$ m.

The flash memory cell of the present invention or the flash memory cell fabricated by the process of fabricating a flash memory cell of the present invention basically includes a source/drain region and a channel region formed in a semiconducting substrate or a silicon layer, a tunnel oxide film formed thereon, a floating gate formed on the tunnel oxide film, an insulating film covering the floating gate, and a control gate.

In the group of silicon single crystal grains or the flash memory cell using the same according to the present invention, the group of silicon single crystal grains may be formed by a process including: a step (a) of irradiating a pulsed rectangular ultraviolet beam on an amorphous or polycrystalline silicon layer formed on the base body (or tunnel oxide film), to thereby form a silicon thin film composed of a group of silicon single crystal grains which are each approximately rectangular-shaped and which are arranged in a grid pattern on the base body (tunnel oxide film), a selected orientation of the silicon single crystal grains to the surface of the base body (tunnel oxide film) being approximately the <100> direction; and a step (b) of separating adjacent ones of the silicon single crystal grains to each other; wherein the moved amount (L) of a ultraviolet beam irradiating position in a period from completion of an irradiation of the rectangular ultraviolet beam to starting of the next irradiation of the rectangular ultraviolet beam is specified at 40 $\mu$m or less, and a ratio (R=L/W) of the moved amount to a width (W) of the rectangular ultraviolet beam measured in the movement direction thereof is in a range of 0.1 to 5%, preferably, in a range of 0.5 to 2.5%.

In the group of silicon single crystal grains and the formation process thereof, and the flash memory cell and the fabrication process thereof according to the present invention, the step (b) of separating adjacent ones of the silicon single crystal grains to each other preferably includes a step of oxidizing the silicon thin film formed in the step (a) to form each region made of silicon oxide between the adjacent ones of the silicon single crystal grains. Alternatively, the step (b) of separating adjacent ones of the silicon single crystal grains to each other preferably includes a step of etching the silicon thin film formed in the step (a) to form each space between the adjacent ones of the silicon single crystal grains. The length of one side of each of the approximately rectangular-shaped silicon single crystal grains in the silicon thin film formed in the step (a) is preferably as short as possibly; however, it is preferably 0.05 $\mu$m or more from a practical standpoint. The average thickness of the silicon thin film formed in the step (a) may be in a range of $1\times10^{-8}$ m to $1\times10^{-7}$ m, preferably, $1\times10^{-8}$ m to $6\times10^{-8}$ m, more preferably, $1\times10^{-8}$ m to $4\times10^{-8}$ m. The opposed sides of each of the approximately rectangular-shaped silicon single crystal grains in the silicon thin film formed in the step (a) may be approximately in parallel to the movement direction of the ultraviolet beam irradiating position or intersect the movement direction of the ultraviolet beam irradiating position at approximately 45°. Crystal planes constituting these two sides are the {220} planes. That is, a crystal plane constituting one side of a silicon single crystal grain approximately rectangular-shaped is the {220} plane.

As the base body or the tunnel oxide film in the present invention, there may be exemplified, while not exclusively, silicon oxide ($SiO_2$), silicon nitride (SiN), SiON, a stacked structure of $SiO_2$—SiN, and a stacked structure of $SiO_2$—SiN—$SiO_2$. The base body or the tunnel oxide film may be formed by oxidization or nitrization of the surface of a silicon semiconducting substrate, or may be formed of a suitable film on a semiconducting substrate, a layer, or an interconnection layer by CVD or the like.

As a ultraviolet beam, there may be exemplified a XeCl excimer laser having a wavelength of 308 nm and a full-solid ultraviolet laser. The width (W) of a rectangular ultraviolet beam measured in the movement direction is preferably in a range of 40 $\mu$m to about 1 mm. The length of a rectangular ultraviolet beam measured in the direction perpendicular to the movement direction may be freely selected. It is desired to use a ultraviolet beam having an extremely sharp rise in energy at an edge portion. As a ultraviolet beam source for generating such a ultraviolet beam, there may be exemplified, while not exclusively, a combination of a XeCl excimer laser source, and attenuator, a beam homogenizer for equalizing a rectangular beam, and a reflection mirror.

When the moved amount (L) of a ultraviolet beam irradiating position in a period from completion of an irradiation of a rectangular ultraviolet beam to stating of the next irradiation of the rectangular ultraviolet beam is more than 40 $\mu$m or a ratio (R=L/W) of the moved amount to the width (W) of the ultraviolet beam measured in the movement direction of the ultraviolet beam irradiating position is more than 5%, there is a fear that a group of silicon single crystal grains which are each approximately rectangular shaped and which are arranged in a grid pattern on a base body are not formed, or that the selected orientation of the silicon single crystal grains to the surface of the base body is out of approximately the <100> direction. Further, when the movement ratio (R=L/W) is less than 0.1% of the width (W) of the ultraviolet beam measured in the movement direction of the ultraviolet beam irradiating position, the throughput becomes excessively low. In addition, the base body may be moved with the ultraviolet beam source kept fixed; the ultraviolet beam source may be moved with the base body kept fixed; or both the ultraviolet beam source and the base body may be moved.

In the case where 30% or more of silicon single crystal grains constituting a group of silicon single crystal grains are selectively oriented approximately in the <100> direction with respect to the surface of a base body, the selected orientation of the silicon single crystal grains constituting the group of silicon single crystal grains to the surface of a base body is specified as approximately the <100> direction. In addition, the approximately <100> direction of silicon single crystal grains contains the case that the <100> direction of the silicon single crystal grains is not strictly in parallel to the direction perpendicular to the surface of a base body. The selected orientation is sometimes called "a preferred orientation". A polycrystalline structure in the form of a film or the like in which crystals are not random-oriented but a large number of the crystals have a crystal axis, crystal plane and the like oriented in a specified direction, is called "an aggregate structure" or "a fiber structure". In this structure, the oriented crystal axis is called the selected orientation.

In the present invention, as described above, by specifying the moved amount (L) of a ultraviolet beam irradiating position in a period from completion of an irradiation of a rectangular ultraviolet beam to starting of the next irradiation of the rectangular ultraviolet beam to be 40 $\mu$m or less, and also specifying a ratio (R=L/W) of the moved amount to the width (W) of the ultraviolet beam measured in the movement direction of the ultraviolet beam irradiating position to be in a range of 0.1 to 5%, there can be formed a silicon thin film composed of a group of silicon single crystal grains which are each approximately rectangular-shaped and which are arranged in a grid pattern on a base body, a selected orientation of the silicon single crystal grains being approximately the <100> direction. The reason for this is unclear, but it may be considered as follows: namely, by irradiating a pulsed rectangular ultraviolet beam (having extremely sharp rise in energy at an edge portion) in a certain region of an amorphous or polycrystalline silicon layer while overlapping and slightly shifting the ultraviolet beams, there is established a repetition of a thermal equilibrium state by heat reservation and a cooling (solidifying) state, to thereby form a group of these silicon single crystal grains. Also, the reason why the selected orientation of silicon single crystal grains to the surface of a base body is approximately the <100> direction may be considered to be due to the free energy on the surface of Si to the base body made of, for example, $SiO_2$.

According to the present invention, there can be easily, effectively formed a silicon thin film composed of a group of silicon single crystal grains arranged in a grid pattern on a base body (insulating film), a selected orientation of the silicon single crystal grains to the surface of the base body being approximately the <100> direction. Accordingly, it becomes possible to highly control and equalize characteristics of a TFT formed of the silicon thin film or to improve a semiconductor device based on the SOI technique by forming a TFT in a fine silicon single crystal grain. Further, since the crystallinity of the silicon thin film is improved in terms of macro-structure, characteristics of a TFT used for LCD panels and the like can be enhanced. Also, there can be realized a flash memory cell (nano dot memory) capable of being operated at a low voltage by directly applying a tunneling effect and electron accumulation. Additionally, by forming a floating gate of a flash memory cell of a silicon thin film of the present invention, variations in sizes of silicon grains forming the floating gate can be reduced, so that there can be realized a flash memory cell hard to be varied in threshold voltage after erasion of data.

DETAILED DESCRIPTION OF THE PREFERRED EMBODIMENTS

Hereinafter, the present invention will be described in detail using the following examples with reference to the accompanying drawings.

EXAMPLE 1

This example concerns a silicon thin film and a formation process thereof according to the present invention. In this example, a silicon thin film composed of a group of silicon single crystal grains was formed on a base body made of $SiO_2$ by irradiating a pulsed ultraviolet beam on an amorphous silicon layer formed on the base body. The irradiation conditions of the ultraviolet beam and the like are shown in Table 1.

TABLE 1

| | |
|---|---|
| ultraviolet beam | XeCl excimer laser (wavelength: 308 nm) |
| irradiated amount | 320 mJ/cm$^2$ |
| pulse width | about 26 nano seconds |
| frequency | about 200 Hz |
| beam shape | rectangular shape: 400 μm (width, W) × 150 mm (length) |
| moved amount L | 4 μm |
| movement ratio R | 1% (= 4 μm/400 μm × 100) |

Figure 1A:
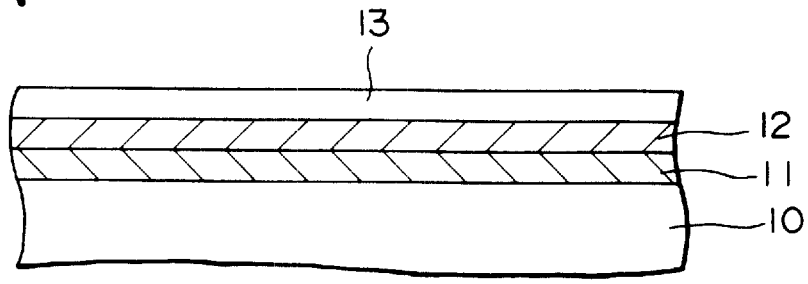
FIG. 1A is a schematic view illustrating a process of forming a silicon thin film in Example 1.
Figure 1B:
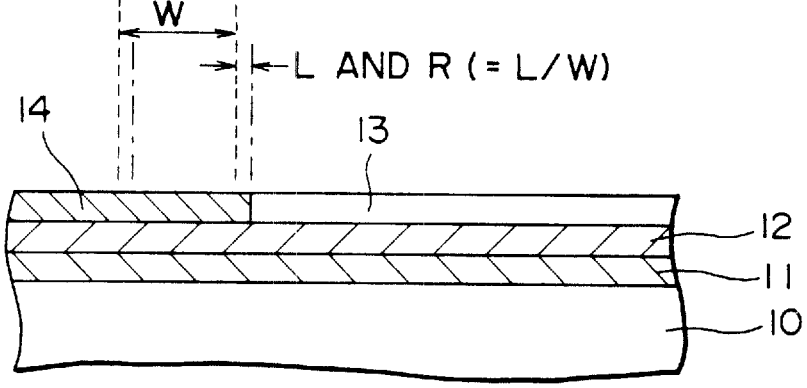
FIGS. 1B and 1C are schematic sectional views of the silicon thin film formed on a base body.
Figure 1C:
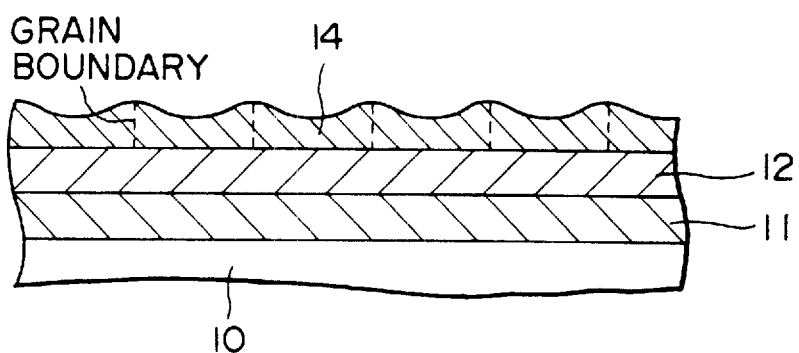

Concretely, a SiN film 11 having a thickness of 50 nm was formed on a substrate 10 made of quartz and a base body 12 made of $SiO_2$ was formed on the SiN film 11 to a thickness of 100 nm. Then, an amorphous silicon layer 13 having a thickness of 30 nm was formed on the base body 12 by PECVD. This state is shown by a schematic sectional view of FIG. 1A. Next, a pulsed ultraviolet beam was irradiated on the amorphous silicon layer 13 formed on the base body 12 in the conditions shown in Table 1. This state is shown by a schematic sectional view of FIG. 1B. In FIG. 1B, a region of the silicon layer 13 on which the preceding ultraviolet beam was irradiated is shown by the dotted line, and a region of the silicon layer 13 on which the present ultraviolet beam was irradiated is shown by the chain line. In this example, since the movement ratio (R=L/W) is 1%, a certain point of the amorphous silicon layer 13 is 100 times exposed to the pulsed ultraviolet beam. Although the substrate 10 was moved with a ultraviolet beam source kept fixed in this example, the ultraviolet beam source may be moved with the substrate 10 kept fixed, or both the substrate 10 and the ultraviolet beam source may be moved. A schematic sectional view of a silicon thin film 14 thus obtained is shown in FIG. 1C. In FIG. 1C, grain boundaries are shown by the dotted line. Each of the silicon single crystal grains has a sectional shape in which the central portion is recessed and the peripheral portion projects.

Figure 2:
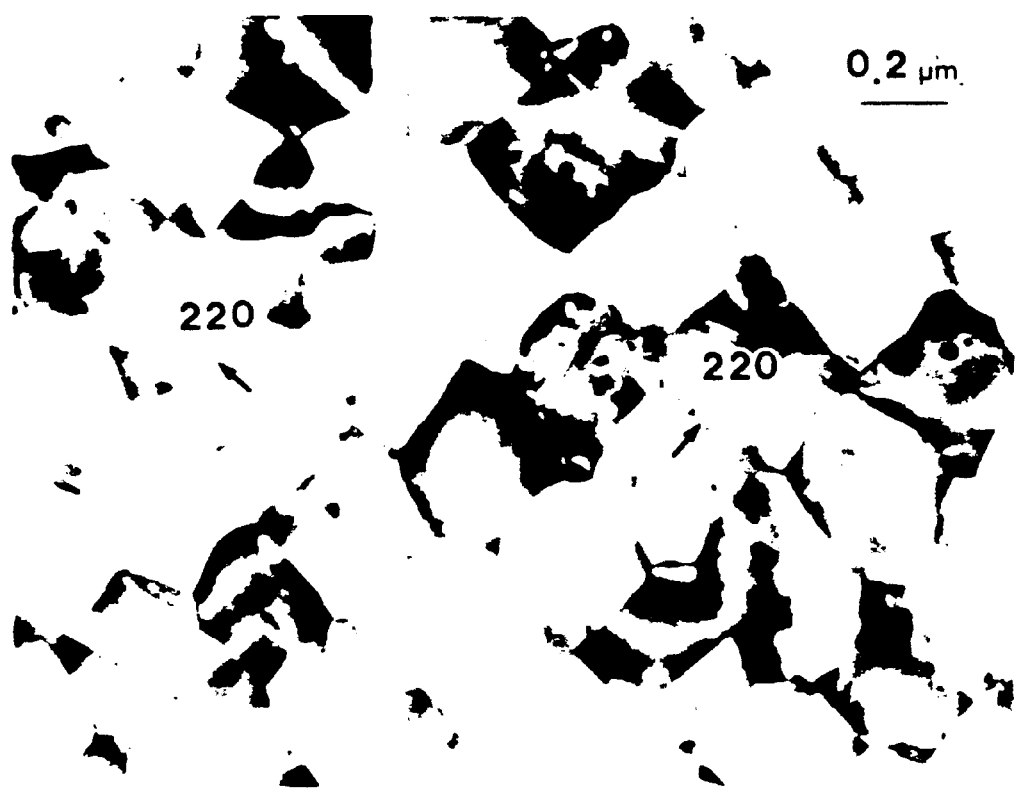
FIG. 2 is a transmission type electron microscopic photograph of the silicon thin film obtained in Example 1.

The silicon thin film thus obtained was observed by a transmission type electron microscope. The result is shown by an electron microscopic photograph in FIG. 2. In addition, a sample for microscopic observation is only a silicon thin film obtained by etching the substrate 10, SiN film 11 and base body 12 using a mixed solution of HF/H$_2$O=1/2. As can be seen from the photograph of FIG. 2, the silicon thin film thus obtained is composed of a group of silicon crystal grains which are approximately rectangular-shaped. The selected orientation of the silicon single crystal grains to the surface of the base body was approximately the <100> direction. The length of one side of the silicon single crystal grain approximately rectangular-shaped was 0.1 μm or more. The opposed two sides of the silicon single crystal grain approximately rectangular-shaped were approximately in parallel to the movement direction of the ultraviolet beam irradiating position. Crystal planes constituting the two sides were the {220} planes. Depending on the observation points, the opposed two sides of the silicon single crystal grain approximately rectangular-shaped intersected the movement direction of the ultraviolet beam irradiating position at approximately 45°.

When a polycrystalline silicon is perfectly non-oriented, a ratio of a refraction intensity $I_{111}$ at the {111} plane to a refraction intensity $I_{220}$ at the {220} plane was $I_{111}:I_{220}$=5:3. Besides, the ratio of $I_{111}:I_{220}$ in the silicon thin film obtained in this example was 1:4. From the analysis of the refraction intensity ratio, it is revealed that the selection orientation of the silicon single crystal grains to the surface of the base body is approximately the <100> direction. In addition, about 30% of the silicon single crystal grains constituting the group of silicon single crystal grains in the silicon thin film were selectively orientated in the <100> direction to the surface of the base body, and the remaining silicon single crystal grains were oriented at random to the surface of the base body. Also, it was frequently observed that the adjacent ones in a unit constituted of several silicon single crystal grains correspond to each other in the crystal orientation.

Figure 3:
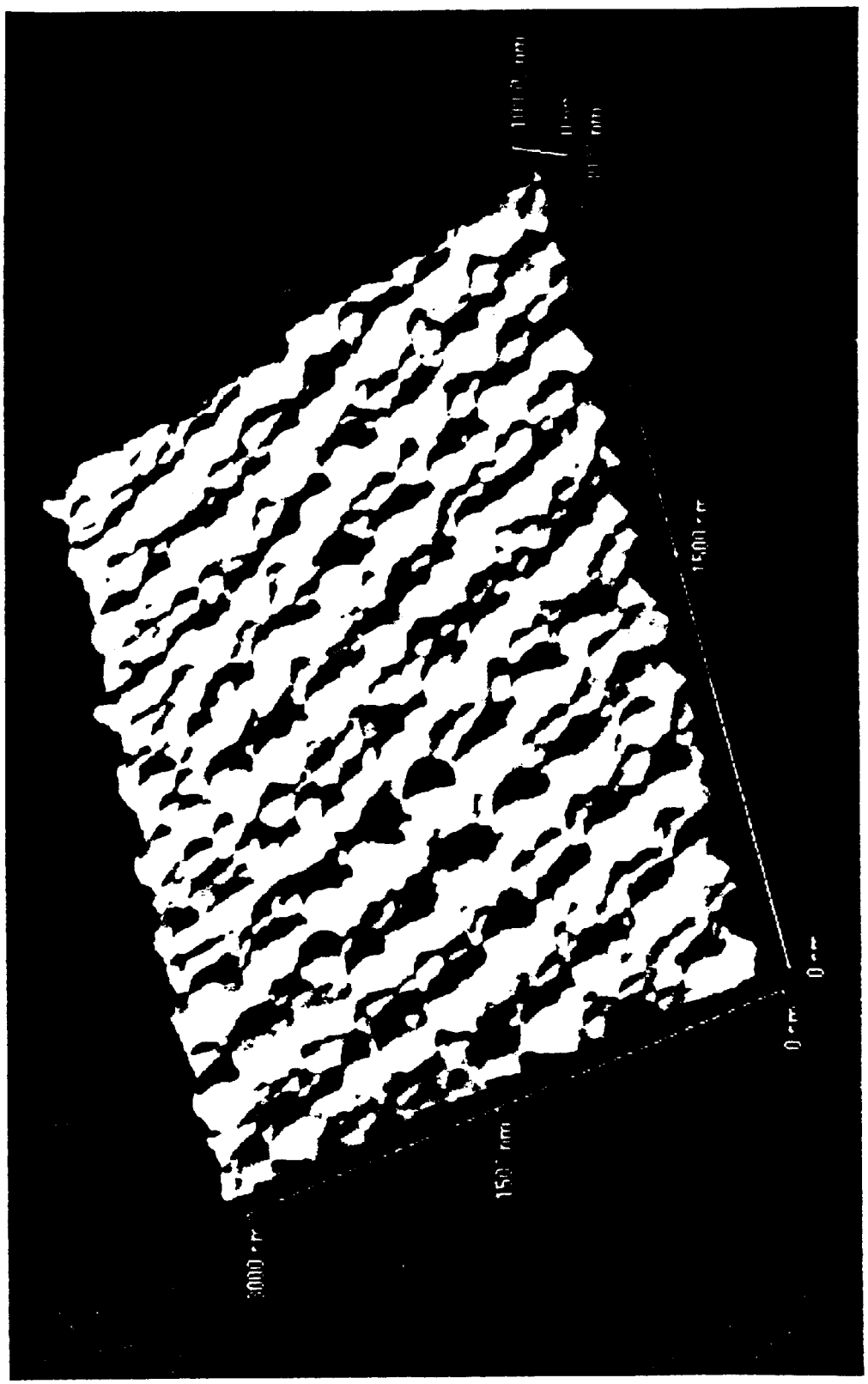
FIG. 3 is a copy of an AFM photograph of the surface of the silicon thin film obtained in Example 1.
Figure 4:
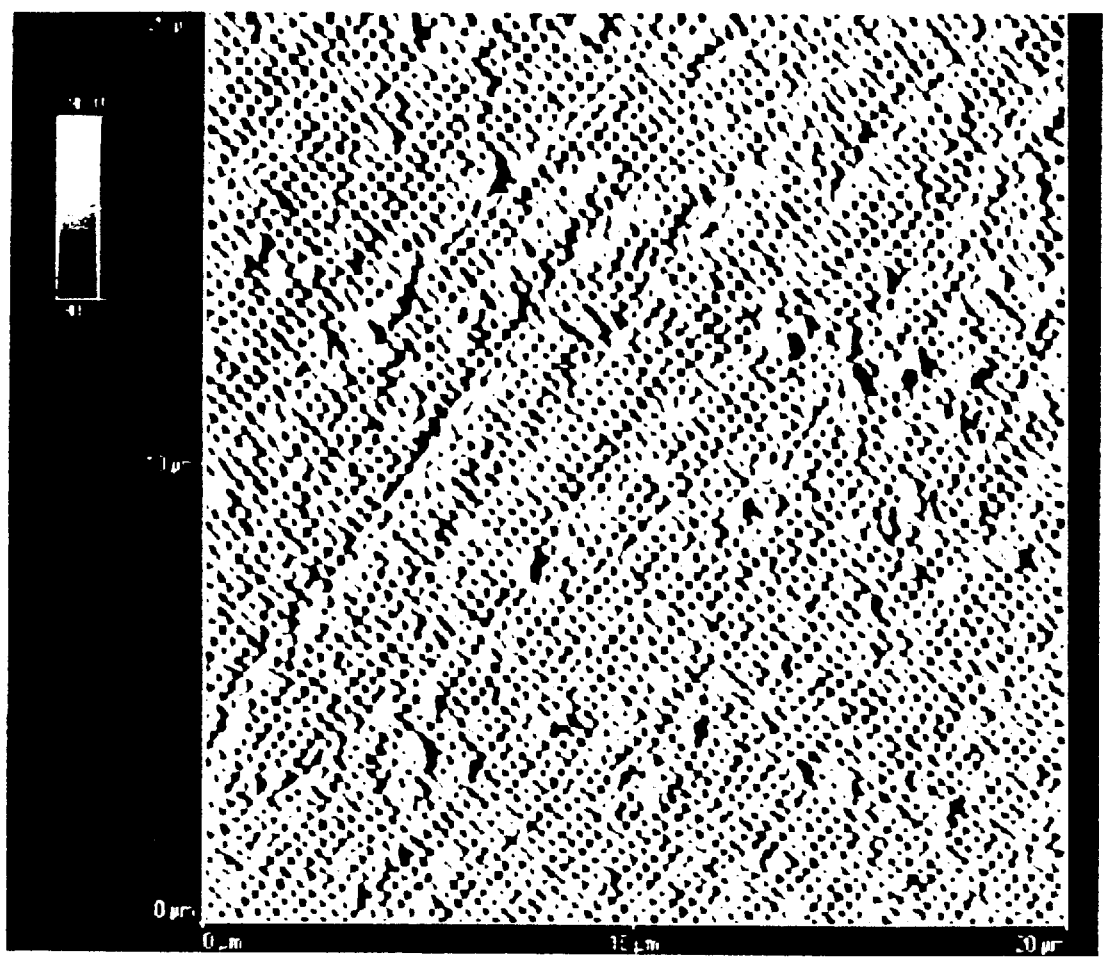
FIG. 4 is a copy of another AFM photograph of the surface of the thin film obtained in Example 1.

The surface of the silicon thin film obtained in this example was observed and measured by an AFM (Atomic Force Microscope). The measured results are shown in Table 3, and the surface observation photographs are shown in FIGS. 3 and 4. In addition, the observation field in FIG. 3 is 3 μm×3 μm, and the observation field in FIG. 4 is 20 μm×20 μm. As can be seen from FIGS. 3 and 4, the silicon thin film is composed of a group of silicon single crystal grains arranged in a grid pattern on the base body. That is, the silicon single crystal grains are regularly arranged in a checkerboard pattern. Also, in FIG. 4, there are observed some linear stripes which leftward, downward extend from the right, upper portion. A gap between the stripe is about 4 μm, which substantially corresponds to the moved amount or amount of movement L of the ultraviolet beam irradiating position. The opposed two sides of the silicon single crystal grain approximately rectangular-shaped were approximately in parallel to the movement direction of the ultraviolet beam irradiating position or intersected the movement direction of the ultraviolet beam irradiating position at approximately 45°.

Comparative Example 1

A silicon thin film was formed on a base body in the same manner as in Example 1, except that the moved amount L and the movement ratio R were different from those in Example 1. The moved amount L and the movement ratio R are shown in Table 2.

Figure 5:
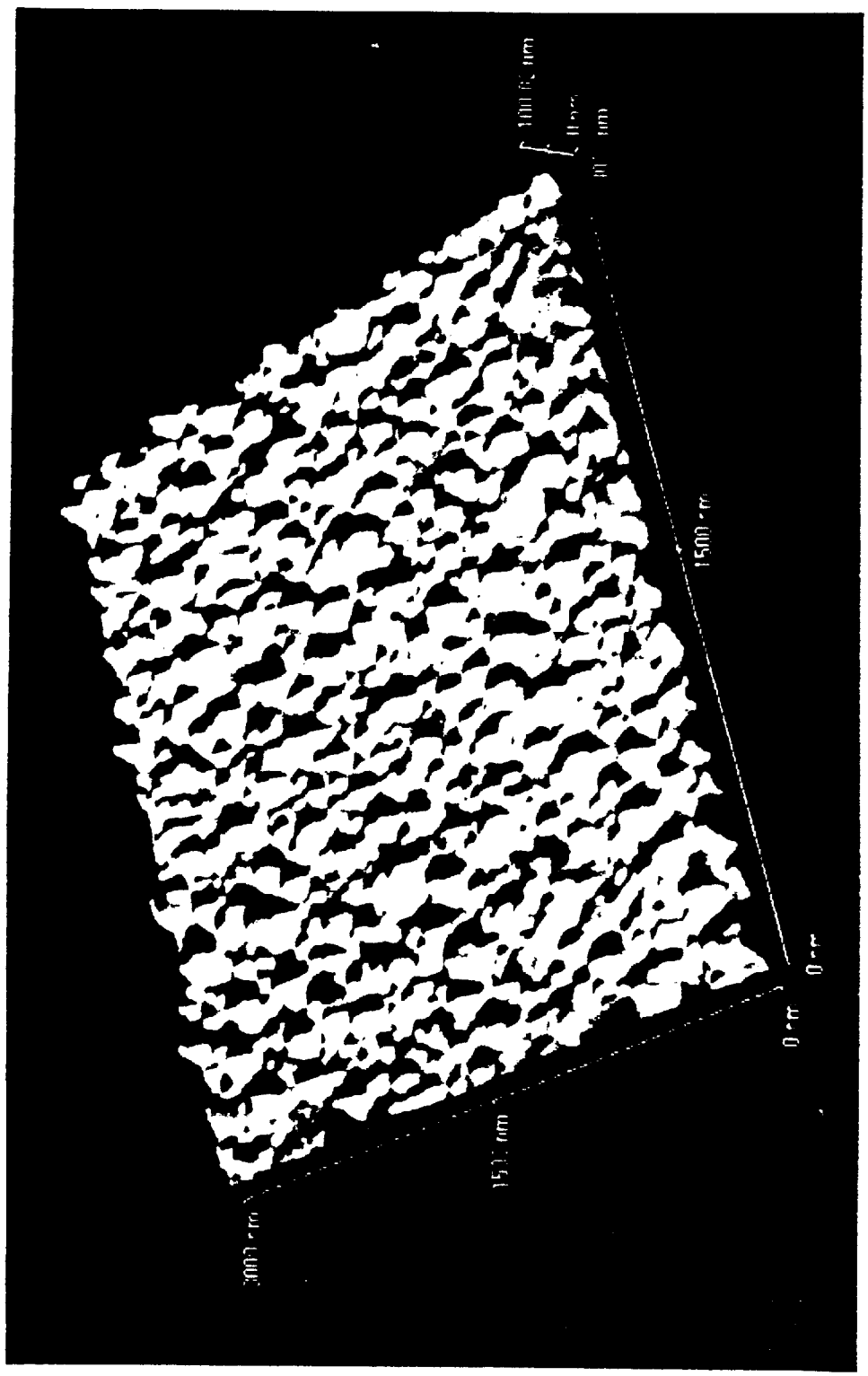
FIG. 5 is copy of an AFM photograph of the surface of a silicon thin film obtained in Comparative Example 1.
Figure 6:
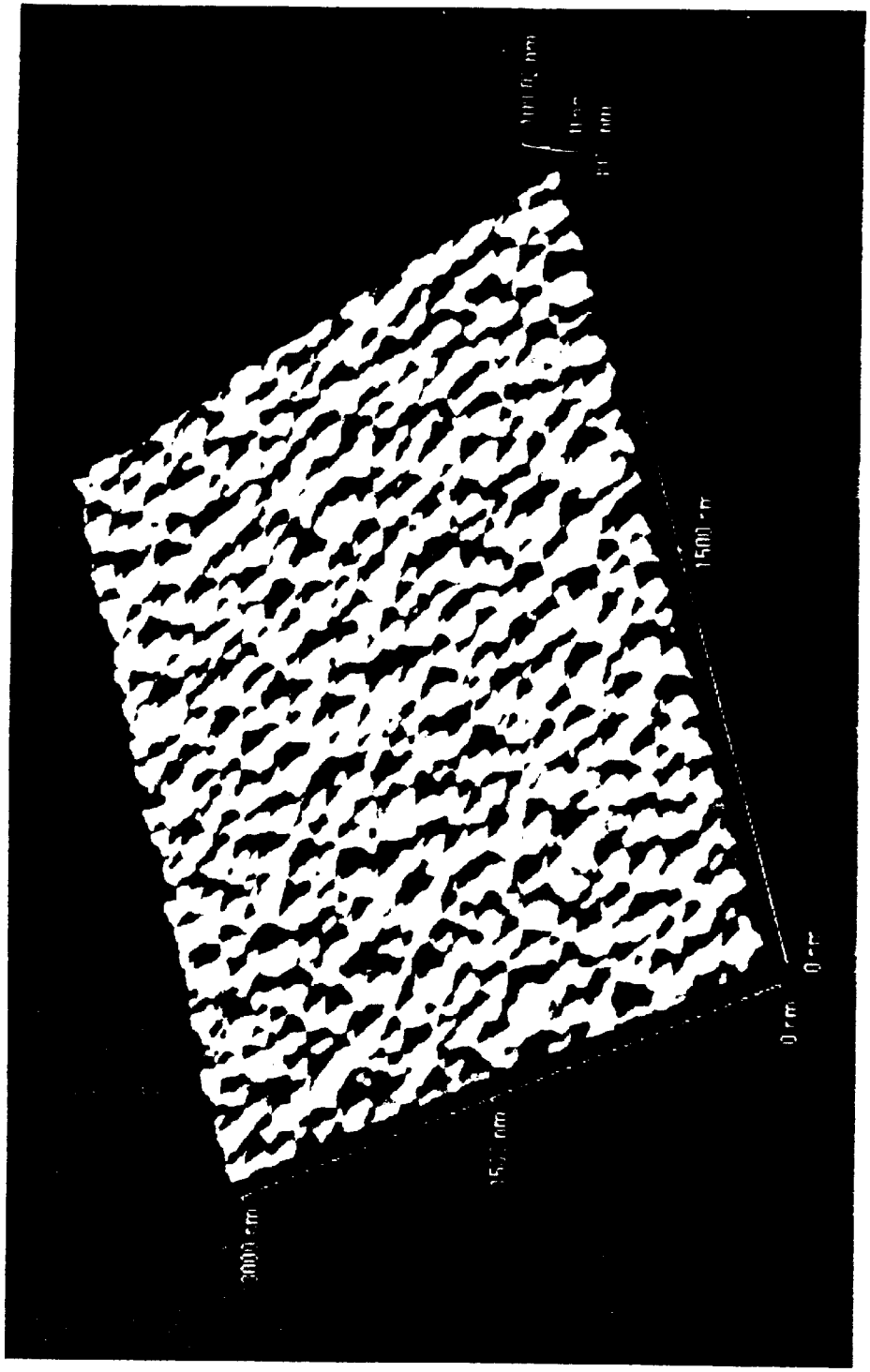
FIG. 6 is a copy of an AFM photograph of the surface of a silicon thin film obtained in Comparative Example 2.

The surfaces of the silicon thin films obtained in Comparative Example 1 were observed and measured. The measured results are shown in Table 3, and the surface observation photographs are shown in FIG. 5 (Comparative Example 1A) and FIG. 6 (Comparative Example 1B). In addition, the observation field in each of FIGS. 5 and 6 is 3 μm×3 μm. As can be seen from FIGS. 5 and 6, for each of the silicon thin films obtained with the moved amount L set at 40 μm or more, single crystal grains are not arranged in a grid pattern on the base body. Further, it is revealed that as the moved amount L is made larger, the number of irregularities of the silicon thin film is made smaller.

Further, experiments were repeated with the irradiated amount of the XeCl excimer laser beam changed into 280 mJ/cm$^2$, 320 mJ/cm$^2$, 340 mJ/cm$^2$ and 360 mJ/cm$^2$; however, any silicon thin film composed of silicon single crystal grains selectively oriented in the <100> direction to the surface of the base body was not formed.

TABLE 2

|  | moved amount L (μm) | movement ratio R (%) |
|---|---|---|
| Comparative Example 1A | 40 | 10 |
| Comparative Example 1B | 200 | 50 |
| Comparative Example 1C | 400 | 100 |

TABLE 3

|  | movement ratio R | Ra (μm) | RMS (μm) |
|---|---|---|---|
| Example 1 | 1% | 11.71 | 14.50 |
| Comparative Example 1A | 10% | 8.66 | 10.83 |
| Comparative Example 1B | 50% | 4.81 | 5.98 |
| Comparative Example 1C | 100% | 5.21 | 6.30 |

EXAMPLE 2

This example concerns a semiconductor device and a fabrication process thereof according to the present invention. In this example, an n-type thin film transistor having a bottom gate structure was fabricated using the process of forming a silicon thin film described in Example 1. An insulating layer 21 made of SiO$_2$ was formed on the surface of a glass substrate 20, and a polycrystalline silicon layer doped with an impurity was deposited over the surface by CVD. The polycrystalline silicon layer was patterned, to form a gate electrode 22. Next, a base body 23 made of SiO$_2$ was formed over the surface by CVD. The base body 23 also functions as a gate oxide film.

Figure 7A:
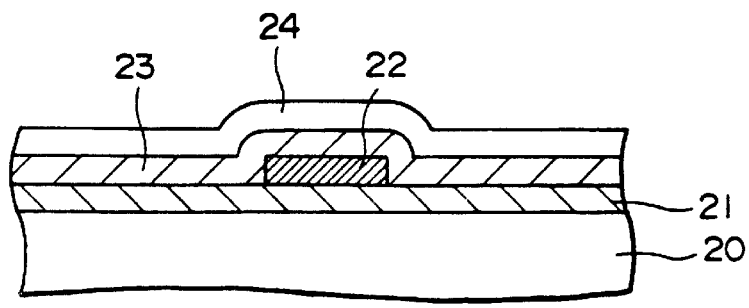
FIGS. 7A to 7C are schematic sectional views of a silicon thin film formed on a base body, illustrating a process of fabricating a semiconductor device in Example 2.
Figure 7B:
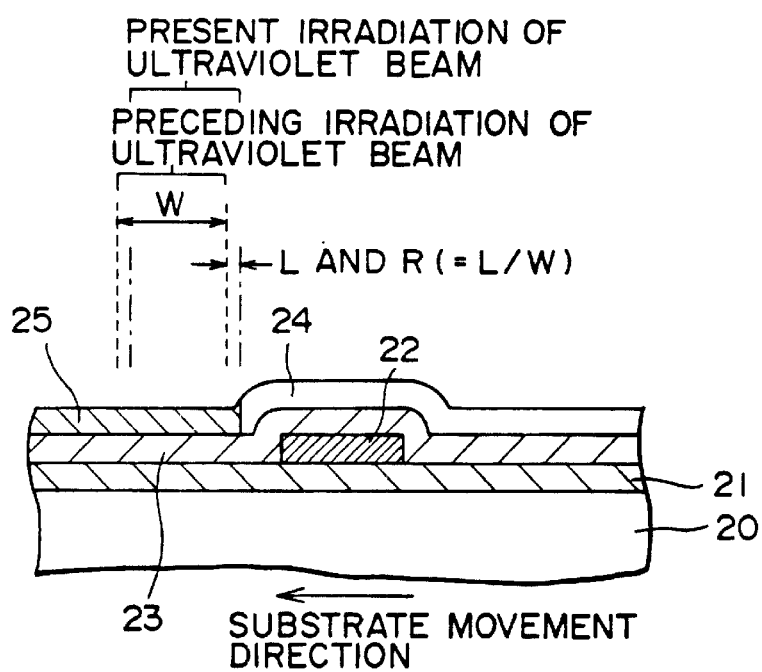
Figure 7C:
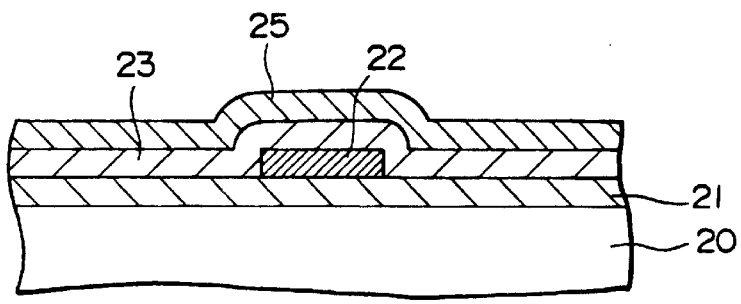

As in Example 1, an amorphous silicon layer 24 having a thickness of 40 nm was formed on the base body 23 made of SiO$_2$ by PECVD, as shown in FIG. 7A. Next, a pulsed ultraviolet beam was irradiated on the amorphous silicon layer 24 thus formed (see FIG. 7B), to form a silicon thin film 25 composed of a group of silicon single crystal grains on the base body (see FIG. 7C). The irradiation conditions of the ultraviolet beam and the like are the same as those shown in Table 1. In addition, a region of the silicon layer 24 on which the preceding ultraviolet beam was irradiated is shown by the dotted line, and a region of the silicon layer 24 on which the present ultraviolet beam was irradiated is shown by the chain line.

Figure 8:
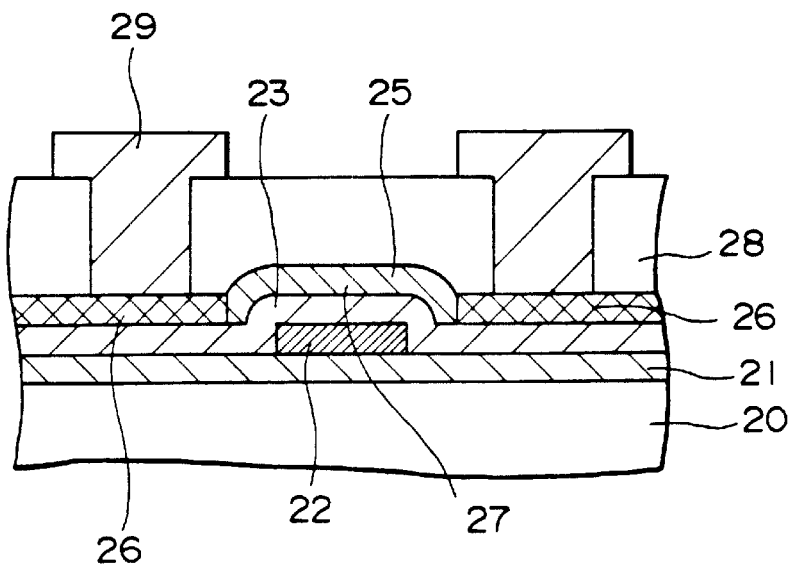
FIG. 8 is a schematic sectional view of a bottom gate type thin film transistor in Example 2.

An impurity was doped in a source/drain region forming area of the silicon thin film 25 by ion implantation, followed by activation of the impurity thus doped, to form a source/drain region 26 and a channel region 27. An insulating layer 28 made of SiO$_2$ was then deposited by CVD, and opening portions were formed in the insulating layer 28 at positions over the source/drain region 26 by lithography and RIE. An interconnection material layer made of an aluminum alloy was deposited on the insulating layer 28 including the opening portions by sputtering, followed by patterning of the interconnection material layer, to form an interconnection 29 on the insulating layer 28 (see FIG. 8). The interconnection 29 is connected to the source/drain region 26 via the interconnection material layer buried in the opening portions.

EXAMPLE 3

An n-type thin film transistor having a bottom gate structure was fabricated in the same manner as in Example 2, except that the moved amount L and the moved amount/beam width R were different from those in Example 2. The moved amount L and the moved amount/beam width R in each of Examples 2 and 3 are shown in Table 4.

Comparative Example 2

An n-type thin film transistor having a bottom gate structure was fabricated in the same manner as in Example 2, except that the moved amount L and the moved amount/beam width R were different from those in Example 2. The moved amount L and the moved amount/beam width R in Comparative Examples 2 are shown in Table 4.

Figure 9:
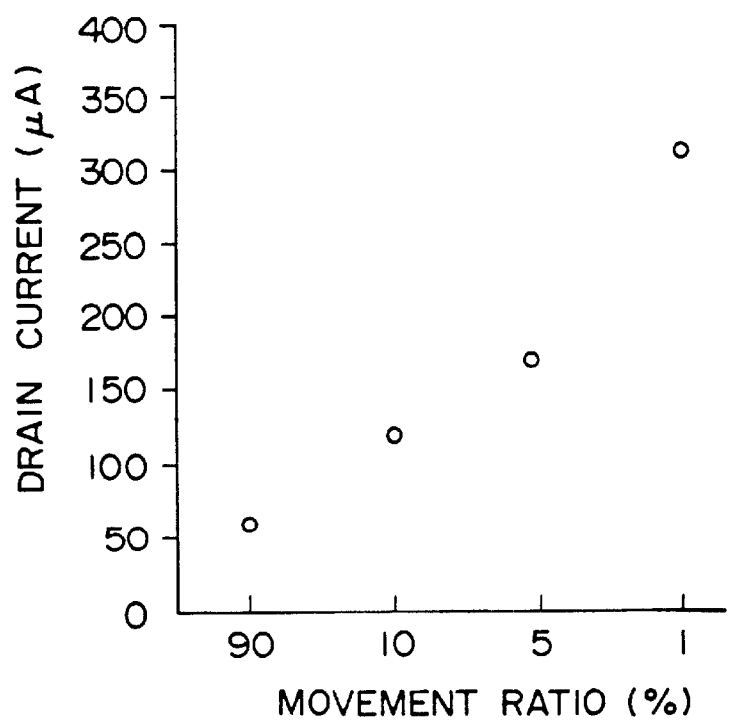
FIG. 9 is a graph showing evaluation results of characteristics of n-type thin film transistors of a bottom gate type in Examples 2, 3 and Comparative Example 2.

The characteristics of the n-type thin film transistors of a bottom gate type obtained in Examples 2, 3 and Comparative Examples 2A, 2B were evaluated by measuring a drain current ($I_{ON}$) with $V_d$=10 V and $V_g$=15 V. The results are shown in FIG. 9. As can be seen from FIG. 9, when the movement R is 5% or less, the drain current ($I_{ON}$) becomes higher.

TABLE 4

| | moved amount L (μm) | movement ratio R (%) |
|---|---|---|
| Example 2 | 4 | 1 |
| Example 3 | 20 | 5 |
| Comparative Example 2A | 40 | 10 |
| Comparative Example 2B | 360 | 90 |

EXAMPLE 4

This example concerns a group of silicon single crystal grains and a formation process thereof, and a flash memory cell and a fabrication process thereof according to the present invention. Hereinafter, this example will be described with reference to FIGS. 10 and 11.

First, element isolation regions 31 having a LOCOS structure was formed in a silicon semiconducting substrate 30, followed by ion implantation for well formation, channel stop, and threshold value adjustment. The element isolation region may be of a trench structure. After that, fine particles and metal impurities on the surface of the silicon semiconducting substrate 30 were removed by RCA cleaning, and then the surface of the silicon semiconducting substrate 30 was cleaned by a solution of 0.1% hydrofluoric acid. Next, a tunnel oxide film (equivalent to a base body) 32 having a thickness of 3 nm was formed on the exposed surface of the silicon semiconducting substrate 30 by a known oxidation process.

Figure 10A:
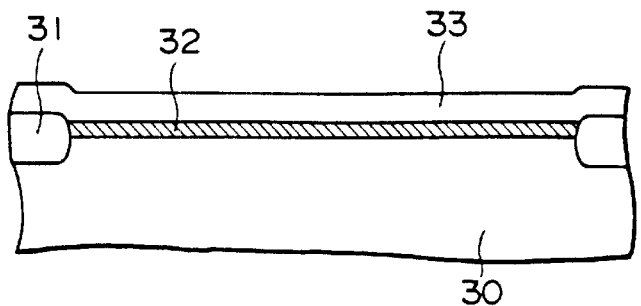
FIGS. 10A to 10C are schematic sectional views of a silicon thin film formed on a tunnel oxide film, illustrating a process of fabricating a flash memory cell in Example 4.
Figure 10B:
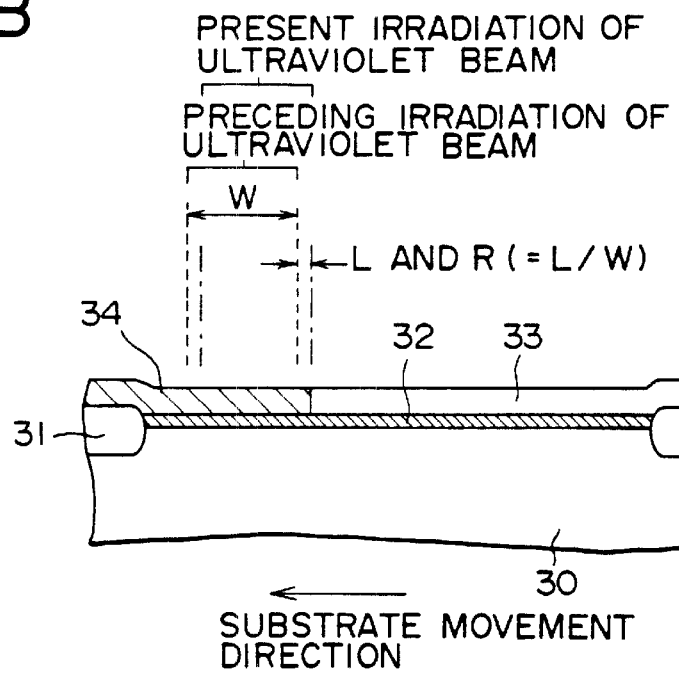
Figure 10C:
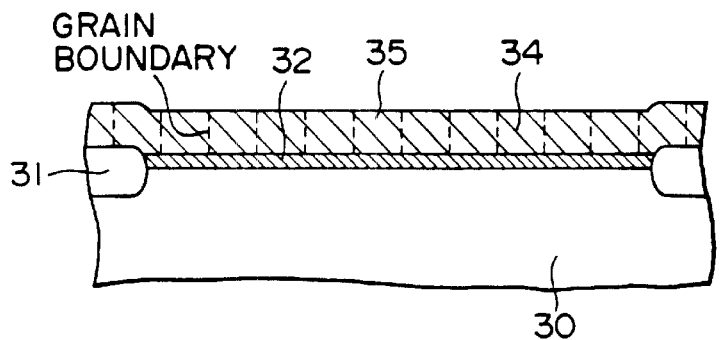
Figure 11A:
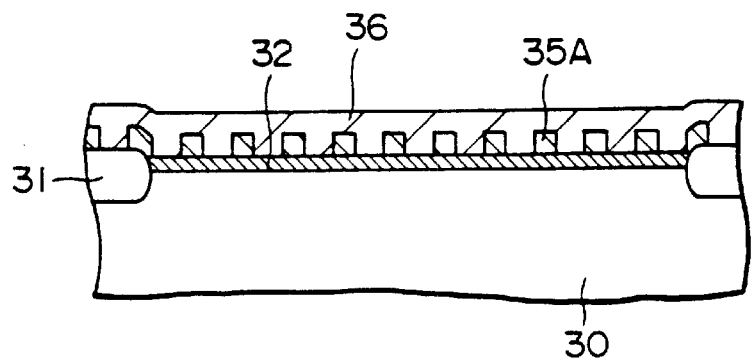
FIGS. 11A and 11B are schematic sectional views, continued to FIGS. 10A to 10C, illustrating the process of fabricating a flash memory-cell in Example 4.

After that, as shown in FIG. 10A, an amorphous silicon layer 33 having a thickness of about 40 nm was formed on the tunnel oxide film 32 by PECVD, as in Example 1. A pulsed ultraviolet beam was irradiated on the amorphous silicon layer 33 (see FIG. 10B), to form a silicon thin film 34 composed of a group of silicon single crystal grains on the tunnel oxide film 32 (see FIG. 10C). The irradiation conditions of the ultraviolet beam and the like are the same as those shown in Table 1. In FIG. 10B, a region of the silicon layer 33 on which the preceding ultraviolet beam was irradiated is shown by the dotted line, and a region of the silicon layer on which the present ultraviolet beam was irradiated is shown by the chain line.

The silicon thin film thus obtained was observed by a transmission type electron microscope and an AFM. It was observed that silicon single crystal grains 35 each having an approximately rectangular shape (length of one side: about 0.3 =μm) were arranged in a grid pattern on the base body. The selected orientation of the silicon single crystal grains to the surface of the base body was approximately the <100> direction. In addition, about 30% of the silicon single crystal grains constituting the group of the silicon single crystal grains were oriented in the <100> direction to the surface of the base body, the remaining silicon single crystal grains were random-oriented to the surface of the base body. Also, in some silicon single crystal grains, the <100> direction was not strictly in parallel to the direction perpendicular to the surface of the base body. Further, it was frequently observed that the adjacent ones in a unit constituted of several silicon single crystal grains correspond to each other in the crystal orientation. Additionally, opposed two sides of the silicon single crystal grain approximately rectangular-shaped were approximately in parallel to the movement direction of the ultraviolet beam irradiating position or intersected the movement direction of the ultraviolet beam irradiating position at approximately 45°.

After that, the adjacent silicon single crystal grains 35 were separated from each other. Concretely, the silicon thin film thus obtained was oxidized in an oxygen gas atmosphere under the temperature condition of 1000° C.×20 min to form each region 36 made of silicon oxide ($SiO_2$) between the adjacent silicon single crystal grains 35A (see FIG. 11A). The average thickness of the silicon single crystal grain 35A thus oxidized was about 10 nm, and the size thereof was 7–13 nm. These silicon single crystal grains 35A, spaced at intervals (about 0.3 μm), were arranged in a grid pattern on the tunnel oxide film (base body) 32. That is, the silicon single crystal grains were regularly arrange in a checker-board pattern. Thus, a floating gate 37 composed of a plurality of the silicon single crystal grains 35A was formed. In general, the oxidation of silicon preferentially proceeds from grain boundaries. The silicon single crystal grains 35 was selectively orientated approximately in the <100> direction to the surface of the tunnel oxide film (base body) 32, so that the thicknesses and the sizes of the silicon single crystal grains can be preferably adjustable.

After that, the regions 36 made of $SiO_2$ were patterned, to remove the unnecessary regions 36 made of $SiO_2$ and the silicon single crystal grains 35A. Then, an insulating film 38 was formed over the entire surface by CVD, and a polycrystalline silicon layer doped with an impurity was formed on the insulating film 38 by CVD, followed by patterning of the polycrystalline silicon layer and the insulating film 38. Thus, a control gate 39 formed of the polycrystalline silicon layer was formed.

Figure 11B:
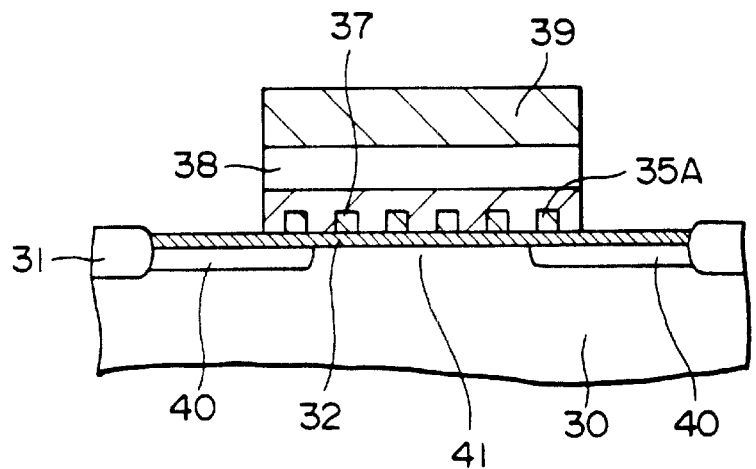

After that, an impurity was doped in a source/drain region forming area of the exposed silicon semiconducting substrate 30 by ion implantation, followed by activation of the impurity thus doped, to form a source/drain region 40 and a channel region 41 (see FIG. 11B). Then, an insulating film made of, for example $SiO_2$ was deposited over the entire surface by CVD, and opening portions were formed in the insulating layer at positions over the source/drain region 40 by photolithography and RIE. An interconnection material layer made of an aluminum alloy was then deposited on the insulating layer including the opening portions by sputtering, followed by patterning of the interconnection material layer, to accomplish an interconnection on the insulating layer. The interconnection is connected to the source/drain region 40 via the interconnection material layer buried in the opening portions. Thus, a flash memory cell (nano dot memory) was fabricated.

Figure 12:
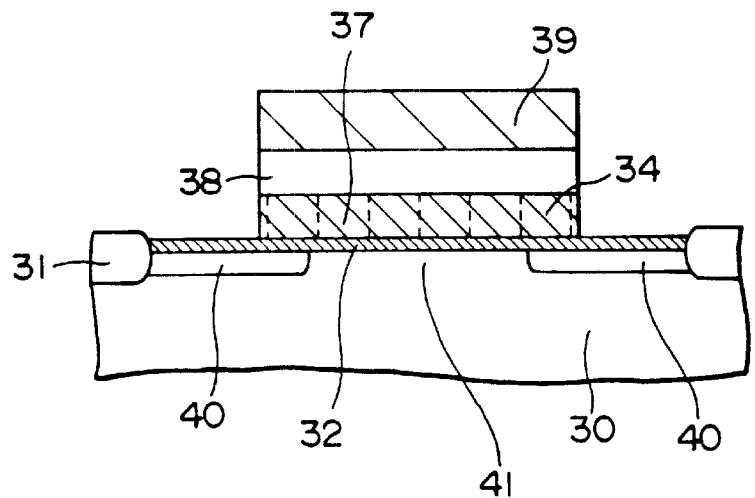
FIG. 12 is a schematic sectional view showing one example in which a floating gate of a flash memory cell is formed of the silicon thin film of the present invention.

While the present invention has been described with reference to the examples, such description is for illustrative purposes only, and it is understood that many changes may be made without departing from the scope of the present invention. For example, although the amorphous silicon layer was formed on the base body in the examples, a polycrystalline silicon layer may be formed on the base body. When a pulsed ultraviolet beam is irradiated on an amorphous or polycrystallinbe silicon layer, the base body may be heated. The surface of a silicon thin film may be planarized by etching-back. Additionally, in the semiconductor device and the fabrication process thereof according to the present invention, one transistor element can be fabricated from one silicon single crystal grain formed on a base body by forming a source/drain region and a channel region in the silicon single crystal grain. In this case, the adjacent silicon single crystal grains may be separated from each other by patterning a silicon thin film by lithography and etching for removing the unnecessary silicon single crystal grains. Alternatively, the adjacent silicon single crystal grains may be separated from each other by oxidizing a silicon thin film formed on a base body made of a material having an etching selection ratio to silicon oxide, for example, silicon nitride, to form each region made of silicon oxide between the adjacent silicon single crystal grains, and etching the silicon oxide. Further, as shown by a schematic sectional view of FIG. 12, a floating gate of a flash memory cell may be formed of a silicon thin film according to the present invention or a floating gate of a flash memory cell may be formed on the basis of the process of forming a silicon thin film according to the present invention.

What is claimed is:

1. A semiconductor device comprising a source/drain region and a channel region formed in a silicon thin film composed of a group of silicon single crystal grains which are each approximately rectangular-shaped and which are arranged in a grid pattern on a base body, wherein a selected orientation of said silicon single crystal grains to the surface of said base body is approximately the <100> direction.

2. A semiconductor device according to claim 1 wherein a length of one side of said silicon single crystal grain approximately rectangular-shaped is 0.05 $\mu$m or more.

3. A semiconductor device according to claim 1, wherein an average thickness of said silicon thin film is in a range of $1\times10^{-8}$ m to $1\times10^{-7}$ m.

4. A semiconductor device according to claim 1, wherein said base body is made of silicon oxide or silicon nitride.

5. A semiconductor device according to claim 1, wherein said group of silicon single crystal grains are formed by irradiating a pulsed rectangular ultraviolet beam on an amorphous or polycrystalline silicon layer formed on said base body, and wherein the moved amount of a ultraviolet beam irradiating position in a period from completion of an irradiation of said rectangular ultraviolet beam to starting of the next irradiation of said rectangular ultraviolet beam is specified at 40 $\mu$m or less, and a ratio of said moved amount to a width of said rectangular ultraviolet beam measured in the movement direction thereof is in a range of 0.1 to 5%.

6. A semiconductor device according to claim 5, wherein opposed sides of said silicon single crystal grain approximately rectangular-shaped are approximately in parallel to the movement direction of the ultraviolet beam irradiating position or intersect the movement direction of the ultraviolet beam irradiating position at approximately 45°.

7. A semiconductor device according to claim 1, which is a thin film transistor of a bottom gate type.

* * * * *